United States Patent [19]

Wen et al.

[11] 4,291,320

[45] Sep. 22, 1981

[54] HETEROJUNCTION IMPATT DIODE

[75] Inventors: Cheng P. Wen, Mission Viejo, Calif.; Reidar L. Kuvas, Eiksmarka, Norway; Anthony A. Immorlica, Jr., Thousand Oaks, Calif.

[73] Assignee: Rockwell International Corporation, El Segundo, Calif.

[21] Appl. No.: 110,965

[22] Filed: Jan. 10, 1980

[51] Int. Cl.³ .................... H01L 29/90; H01L 29/161
[52] U.S. Cl. ........................................ 357/13; 357/16
[58] Field of Search ............................ 357/13, 16, 89

[56] References Cited

U.S. PATENT DOCUMENTS 4,186,407  1/1980  Dolagebeaudeuf ................... 357/13

Primary Examiner—Martin H. Edlow
Attorney, Agent, or Firm—H. Frederick Hamann; Craig O. Malin

[57] ABSTRACT

A double drift IMPATT diode is formed from two semiconductors having different band gaps and carrier mobilities. The avalanche portion of the diode is created in the semiconductor having the lower band gap. The electron drift portion is created in the semiconductor having the higher electron mobility and the hole drift portion is created in the semiconductor having the higher hole mobility. This decreases the voltage required across the avalanche portion, decreases the series resistance, and thus increases the efficiency of the diode.

7 Claims, 3 Drawing Figures

HETEROJUNCTION IMPATT DIODE

BACKGROUND OF THE INVENTION

1. Field of the Invention

This invention relates to the field of IMPATT diodes, and particularly to Read-type double drift IMPATT diodes.

2. Description of the Prior Art

IMPATT diodes have found extensive use in solid-state microwave components due to their excellent power-generating capabilities at C-band and higher frequencies. The performance of IMPATT power sources has advanced rapidly as continuing technology improvements have resulted in diodes with higher conversion efficiencies and output power. Technological problems favored the use of Si in the early stages of IMPATT development. However, promise of higher efficiency prompted intensive efforts to develop GaAs IMPATT technology. These efforts have culminated with the development of Read-type device structures with high-low and low-high-low doping profiles. Such devices have advanced the state-of-the-art significantly by exhibiting conversion efficiencies greater than 30% at X band frequencies.

The advantage of Read-type devices can be understood in terms of the basic operating principles of IMPATT diodes. A thin avalanche region is needed to inject an inductively delayed charge pulse into a drift region. In a double drift structure, separate drift regions are provided for holes and electrons. The further transport delay in the drift regions results in a negative resistance. Ideally, the carriers should drift at scattering-limited velocities in the drift regions, which requires a certain minimum field to be maintained during the RF cycle. This minimum drift field is typically one to two orders of magnitude lower than the breakdown field. Thus, the avalanche voltage will contribute significantly to the operating voltage (typically 30–50%) in spite of the avalanche region being thin.

The large avalanche voltage is a major factor in compromising the efficiency of IMPATT diodes because the efficiency of a diode is limited to first order by its voltage as follows:

$$\text{Efficiency} \sim \frac{V_D}{V_A + V_D} \times 100;$$

where:
  $V_D$ = drift voltage, and
  $V_A$ = avalanche voltage.

Prior art double drift IMPATT diodes are created by reverse biasing a p-n junction that is formed in a single semiconductor such as Si or GaAs. The efficiency obtained by such homojunction diodes can be increased utilizing various doping profiles to optimize the structure. However, the device performance is ultimately limited by the inherent physical properties of the material, particularly the band gap energy and the carrier mobilities. The avalanche voltage is directly proportional to the bandgap energy while the series resistance of the diode is inversely proportional to the carrier mobility in the drift region. The prior art use of a single material to construct double drift IMPATT diodes greatly limits design flexibility and the capability of the diode. For example, Ge has an energy gap of 0.72 eV which is low compared to the energy gap of 1.40 eV for GaAs. Hence, a Ge diode requires a lower avalanche voltage than a GaAs diode. However, Ge has an electron mobility of only 3900 cm$^2$/V sec compared to GaAs electron mobility of 8500 cm$^2$/V sec. Consequently, Ge homojunction IMPATT diodes suffer from their relatively low electron drift mobility as compared to GaAs.

SUMMARY OF THE INVENTION

It is an object of the invention to provide an IMPATT diode having improved efficiency.

It is an object of the invention to provide an IMPATT diode which operates at low voltage.

It is an object of the invention to provide an improved IMPATT diode for use in microwave power generation and amplification.

It is an object of the invention to provide an improved IMPATT diode for use in electronic counter measure, radar, and communication systems.

It is an object of the invention to provide an IMPATT diode with a low series resistance.

It is an object of the invention to provide an IMPATT diode having an RF impedance which is not highly sensitive to the carrier concentration in the avalanche zone.

According to the invention, a double drift IMPATT diode is formed from two semiconductors having different band gaps. The avalanche portion of the diode is created in the semiconductor having the lower band gap. The respective drift portions are created in the semiconductor having the more optimum mobilities. This decreases the voltage required across the avalanche portion, decreases the series resistance, and thus increases the efficiency of the diode.

These and other objects and features of the present invention will be apparent from the following detailed description, taken with reference to the accompanying drawings.

DESCRIPTION OF THE PREFERRED EMBODIMENT

Figure 1:
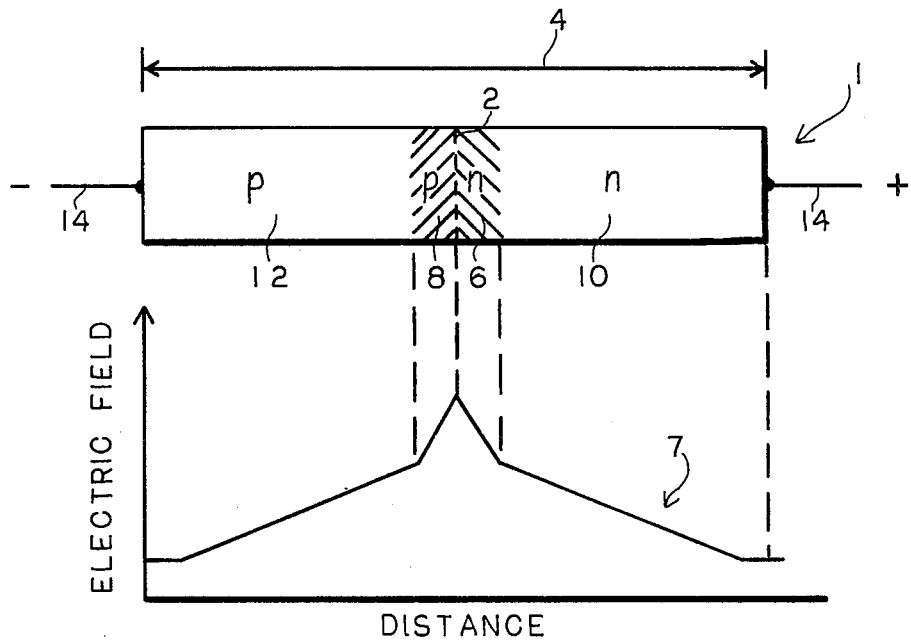
FIG. 1 is a schematic diagram of a double drift IMPATT diode according to the prior art and a curve showing the relative electric field along the length of the diode.

FIG. 1 is a diagram illustrating the construction of a double drift IMPATT diode 1 according to the prior art. The diode is a p-n junction 2 in a GaAs semiconductor 4. Junction 2 is created in semiconductor 4 by doping in a known manner. A first avalanche region 6 is formed on the n side of p-n junction 2 by doping region 6 slightly higher than the remaining electron drift region 10 (n charges). A second avalanche region 8 is formed on the p side of p-n junction 2 by doping region 8 slightly higher than the remaining hole drift region 12 (p charges). Known techniques of doping are used to define the shape of the electric field 7 and to confine avalanche region 6, 8 to a narrow zone, thereby increasing the device efficiency.

Metal conductors 14 are used to apply a reverse bias to the diode. Since the bias is reverse, the applied voltage must be sufficiently high to cause breakdown of the p-n junction and current flow through the diode. Such breakdown and current flow is attributed to avalanche multiplication of electrons and holes in the avalanche region of the diode and drift of majority carriers in drift regions 10, 12. As shown in the plot of FIG. 1, a high electric field 7 is required in the narrow avalanche regions 6, 8 because of the high bandgap in GaAs.

Figure 2:
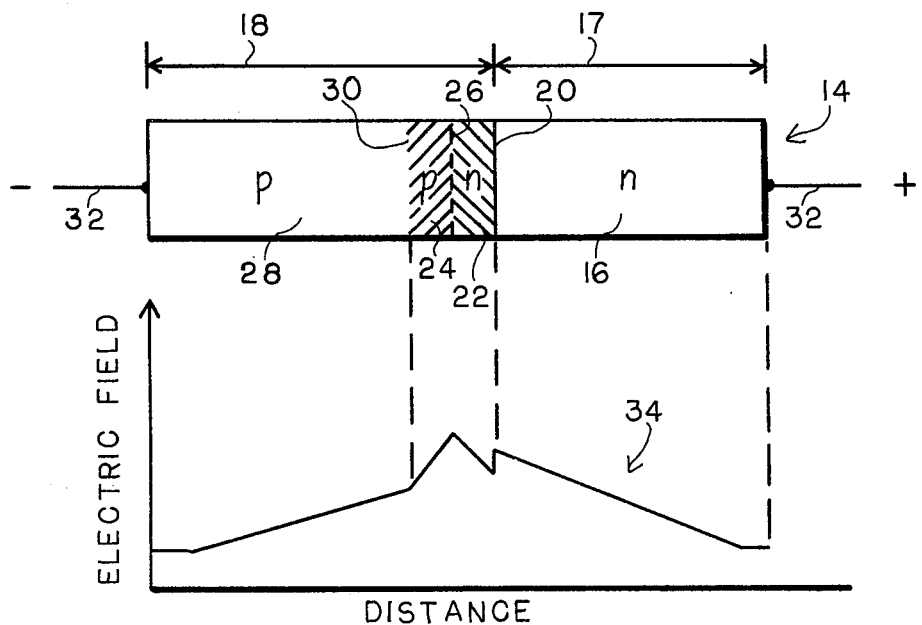
FIG. 2 is a schematic diagram of a double-drift IMPATT diode according to the invention and a curve showing the relative electric field along the length of the diode.

FIG. 2 is a diagram illustrating the construction of heterojunction double drift IMPATT diode 14 according to an embodiment of the invention. An electron drift region 16 is formed by a first semiconductor 17 such as GaAs or InP which is joined to a second semiconductor 18 such as Ge or a GaInAs alloy by means of a heterojunction 20. Heterojunction 20 is an epitaxial continuation of the crystal structure of the first semiconductor into the crystal structure of the second semiconductor. In order for the heterojunction to be sufficiently uniform and stress free, the mismatch in lattice size between the crystal structure of the two semiconductors should be small and preferably less than about 2% $(2(A-B)/(A+B) \times 100 < 2\%)$. For diodes that are subjected to temperature changes, it is desirable that the thermal expansion coefficients of the two semiconductors be closely matched in order to minimize stresses in the heterojunction. A $Ga_{0.47}In_{0.53}As$ alloy has suitable matching characteristics for use with InP.

Second semiconductor 18 is doped in a known manner to define the electric field creating avalanche regions 22, 24 of desired width. In the embodiment shown in FIG. 2, this is accomplished by creating p-n junction 26 in semiconductor 18. The remaining region of semiconductor 18 is hole drift region 28. The doping which forms p-type avalanche region 24 is slightly higher than the doping which forms p-type drift region 28, thus defining the boundary 30 of avalanche region 24.

Metal conductors 32 are attached to first and second semiconductors 17, 18 so that a reverse bias can be applied to diode 14.

When IMPATT diode 14 of FIG. 2 is under its operating bias, avalanche regions 22, 24 are created in second semiconductor 18 between hole drift region 28 and heterojunction 20. As can be seen by comparing electric field 7 (of FIG. 1) with electric field 34 (of FIG. 2), a much lower electric field is created in avalanche regions 22, 24 because second semiconductor 18 is selected to have a lower bandgap than first semiconductor 17. The lower the bandgap of the semiconductor, the lower the electric field required to initiate avalanche multiplication of electrons and holes.

To improve the efficiency of the double drift diode, semiconductor materials are selected to take advantage of their high carrier or charge drift mobility and thereby lower the series resistance of the diode. For example, in the GaAs to Ge diode, GaAs is favored for the electron drift region 16 because GaAs has an electron drift mobility of 8500 cm²/volt-sec as compared to only 3900 cm²/volt-sec for Ge. However, Ge is favored for the hole drift region 28 because Ge has a hole drift mobility of 1900 cm²/volt-sec as compared to only 400 cm²/volt-sec for GaAs.

The operating frequency of the double drift IMPATT is ideally determined by the length of the drift regions 16, 28 which are chosen to have a transit angle equal to $\pi$ radians. The transit angle is given by:

$$2\pi fl/v$$

where f is the frequency, v is the saturation velocity of the majority carrier and l is the drift length. Taking the high temperature drift velocity of electrons in GaAs as $8 \times 10^6$ cm/sec and of holes in Ge of $7 \times 10^6$ cm/sec, we calculate, for a 10 GHz device, drift region lengths of 3.5 microns and 4.0 microns, respectively, for the p-type Ge and n-type GaAs respectively. The combined avalanche regions 22, 24 can be typically 5 to 10% of the combined drift region lengths. The doping concentration in the drift regions 16, 28 is chosen low enough so that the electric field remains above the critical value necessary to maintain a saturated carrier velocity flow. For a 10 GHz design, a value of $2 \times 10^{15}$ cm$^{-3}$ is suitable. The avalanche region doping is not critical but is chosen to be high enough to confine the avalanche process in that region. A typical value of $7 \times 10^{16}$ cm$^{-3}$ is appropriate for an X-band design.

Calculations of breakdown field and voltage vs avalanche widths have been carried out by using known ionization rates for the materials. An avalanche width of 0.5 μm should be suitable for Ge X-band devices giving an avalanche voltage of approximately 13 V and a breakdown field of $2.7 \times 10^5$ V/cm. Corresponding numbers for GaAs are 18 V and $5 \times 10^5$ V/cm, respectively. The difference between the avalanche voltages will increase at actual operating temperatures, so that a reduction in the avalanche voltage of up to 10 V appears feasible for the heterojunction structure. This implies a voltage reduction of approximately 15-20% for typical operating conditions.

The large-signal saturation behavior strongly affects ultimate efficiency, so that minimizing the avalanche voltage will not necessarily maximize the efficiency. The key parameter for the saturation behavior is the ratio between the slope of the inverse multiplication function 1/M vs electric field at breakdown and the intrinsic response time $\tau_1$. A steep slope of 1/M and a short response time results in a highly nonlinear avalanche current response at low RF amplitudes, i.e., premature power saturation. A moderate value of the ratio between this slope and $\tau_1$ is needed to obtain the proper trade-off between nonlinear current response and slow saturation.

The intrinsic response times for the Ge and GaAs avalanche layers are estimated to be 6 and 3 ps respectively, based on calculations and experimental data. Resulting behavior of the generation function $(\omega_o M \tau_1)^{-1}$ shows a steeper slope at breakdown for GaAs than for Ge. Therefore, the Ge-GaAs heterojunction IMPATT is expected to display less rectification and slower large-signal saturation than the GaAs Read-type diode. These effects will further increase the efficiency advantage of the heterojunction structure. However, the current density required for proper biasing will be about 3 times higher in the Ge-GaAs diode than for the GaAs low-high-low IMPATT due to the difference in the slope of the generation function. Thus, a well designed Ge-GaAs IMPATT will have a smaller area than a prior art GaAs IMPATT.

Figure 3:
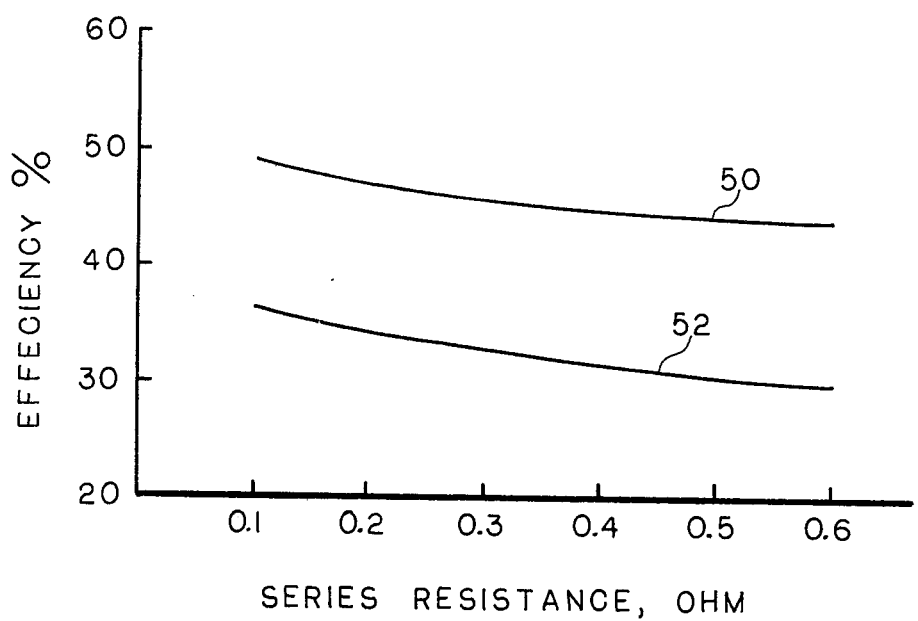
FIG. 3 are curves showing the efficiency of homojunction and heterojunction IMPATT diodes and as a function of their series resistance.

Detailed large-signal calculations indicate that the efficiency can be up to a factor of 1.5 higher for the heterojunction structure 50 than for the GaAs diode 52 as shown in FIG. 3. The corresponding advantage in the output power is reduced to a factor of 1.3 due to the higher thermal impedance of the heterojunction design. Ge-GaAs design can provide output powers of 15-20 W at 10 GHz and efficiencies up to 45% at reasonable levels of the series resistance.

These calculations have assumed a voltage modulation depth of 90% for the Ge-GaAs design vs 70% for the GaAs diode. Additional device modeling has been carried out to assess the variations in the output power and the efficiency for the heterojunction diode as functions of the voltage modulation level. The results show that 80% modulation is required to exceed an efficiency of 40%.

These calculations have ignored possible deleterious effects due to high reverse saturation current. This question may be of real concern for the heterojunction diode due to the low bandgap of Ge. Thus, it may be necessary to limit the junction temperature rise to less than 200° C., which was assumed in the calculations. A lower operating temperature would compromise the output power, while the conversion efficiency would remain largely unaffected. One beneficial effect of the expected high level of saturation current would be to limit the build-up of large-signal noise, leading to large-signal noise measures around 35 dB. The relatively low level of noise combined with the expected slow saturation would make the Ge-GaAs heterojunction IMPATT an excellent choice for the middle stages of power amplifiers.

Fabrication of double drift heterojunction IMPATT diodes requires material preparation techniques which achieve adequate doping profile control. Techniques such as $GeI_2$ disproportionation for growth of Ge or GaAs or liquid phase epitaxy for growth of GaInAs on InP are known in the prior art. Electrical contacts, specific dopants, dopant levels, and other details of fabrication are accomplished according to techniques that are well established in the art of solid state electronics.

Numerous variations and modifications may be made without departing from the present invention. Accordingly, it should be clearly understood that the form of the present invention described above and shown in the accompanying drawings is illustrative only and is not intended to limit the scope of the present invention.

What is claimed is:

1. A double drift IMPATT diode comprising:
   a first semiconductor of a first conductivity type having a first bandgap, said first semiconductor comprising a drift region of said first conductivity type;
   a second semiconductor of a conductivity type opposite said first conductivity type joined to said first semiconductor by a heterojunction, said second semiconductor having a second bandgap, said second bandgap being lower than said first bandgap;
   a first avalanche region of said first conductivity type in said second semiconductor adjacent said heterojunction;
   a second avalanche region of said opposite conductivity in said second semiconductor abutting said first avalanche region to form a p-n junction;
   a drift region of said opposite conductivity type in said second semiconductor abutting said second avalanche region, said drift region of opposite conductivity type being less heavily doped than said second avalanche region; and
   means for applying a reverse bias to said first and second semiconductors of sufficient voltage to cause avalanche multiplication of electrons and holes in said first and second avalanche regions, and drift of charge carriers of said first conductivity type in said drift region of first conductivity type, and drift of charge carriers of said opposite conductivity type in said drift region of opposite conductivity type.

2. The diode as claimed in claim 1, wherein said first semiconductor comprises GaAs and said second semiconductor comprises Ge.

3. The diode as claimed in claim 1, wherein said first semiconductor comprises InP and said second semiconductor comprises a GaInAs alloy.

4. The diode as claimed in claim 3 wherein said GaInAs alloy comprises $Ga_{0.47}In_{0.53}As$.

5. The diode as claimed in claim 1, wherein said means for applying a reverse bias comprises a first electrical contact on said first semiconductor and a second electrical contact on said second semiconductor.

6. The diode as claimed in claim 1, wherein said first semiconductor has a first lattice and said second semiconductor has a second lattice, and wherein any mismatch between said first and second lattices is less than 2%.

7. A double drift IMPATT diode comprising:
   a first semiconductor of n-conductivity having a first lattice and having a first bandgap, said first semiconductor comprising an n-drift region;
   a second semiconductor joined to said first semiconductor by a heterojunction, said second semiconductor having a second lattice and having a second bandgap, any mismatch between said first and second lattices being less than 2%, said second bandgap being lower than said first bandgap;
   a first avalanche region of n-conductivity in said second semiconductor adjacent said heterojunction;
   a second avalanche region of p-conductivity in said second semiconductor abutting said first avalanche region to form a p-n junction;
   a p-drift region in said second semiconductor abutting said second avalanche region, said p-drift region being less heavily doped than said second avalanche region; and
   means for applying a reverse bias to said first and second semiconductors of sufficient voltage to cause avalanche multiplication of electrons and holes in said first and second avalanche regions, and to cause drift of electrons in said n-drift region and drift of holes in said p-drift region.

* * * * *